(12) United States Patent
Kaneyama

(10) Patent No.: US 6,720,558 B2
(45) Date of Patent: **\*Apr. 13, 2004**

(54) TRANSMISSION ELECTRON MICROSCOPE EQUIPPED WITH ENERGY FILTER

(75) Inventor: Toshikatsu Kaneyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 67 days.

This patent is subject to a terminal disclaimer.

(21) Appl. No.: 10/056,218

(22) Filed: Jan. 24, 2002

(65) Prior Publication Data

US 2002/0153484 A1 Oct. 24, 2002

Related U.S. Application Data

(63) Continuation-in-part of application No. 09/773,792, filed on Feb. 1, 2001, now Pat. No. 6,586,737.

(30) Foreign Application Priority Data

Feb. 2, 2000 (JP) .............................. 2000-025354
Jan. 24, 2001 (JP) .............................. 2001-015537

(51) Int. Cl.$^7$ ............................ H01J 49/44; H01J 37/05

(52) U.S. Cl. .................. 250/311; 250/305; 250/396 R; 250/396 ML (58) Field of Search ............................ 250/311, 305, 250/396 R, 396 ML (56) References Cited

U.S. PATENT DOCUMENTS 6,323,485 B1 \* 11/2001 Tsuno ..................... 250/311

\* cited by examiner

Primary Examiner—Nikita Wells
(74) Attorney, Agent, or Firm—Webb Ziesenheim Logsdon Orkin & Hanson, P.C.

(57) ABSTRACT

A transmission electron microscope (TEM) equipped with an energy filter, the microscope being characterized in that rotation of the created image or diffraction pattern is prevented. The microscope has 6 lens systems, i.e., an objective lens system, four intermediate lens systems, and a projector lens system. If the mode of operation is varied, the total sum of the products of the numbers of turns of wire on the coils of the lenses of the various lens systems including the objective lens system, the four intermediate lens systems, and the projector lens system, and their respective excitation currents is kept constant.

7 Claims, 4 Drawing Sheets

TRANSMISSION ELECTRON MICROSCOPE EQUIPPED WITH ENERGY FILTER

CROSS REFERENCE TO RELATED APPLICATION

This application is a continuation-in-part of U.S. patent application Ser. No. 09/773,792, filed Feb. 1, 2001, now U.S. Pat. No. 6,586,737.

BACKGROUND OF THE INVENTION

1. Field of the Invention

The present invention relates to a transmission electron microscope (TEM) equipped with an energy filter.

2. Description of the Related Art

A transmission electron microscope (TEM) equipped with an energy filter has been heretofore known. An energy filter has a function of energy-dispersing electrons transmitted through a specimen. A TEM equipped with an energy filter is capable of selecting only those electrons transmitted through a specimen which have a certain energy and imaging them. Hence, the contrast and resolution of the image can be improved. Also, this kind of instrument can gain an energy loss spectrum and a two-dimensional distribution of elements constituting the specimen.

Figure 2:
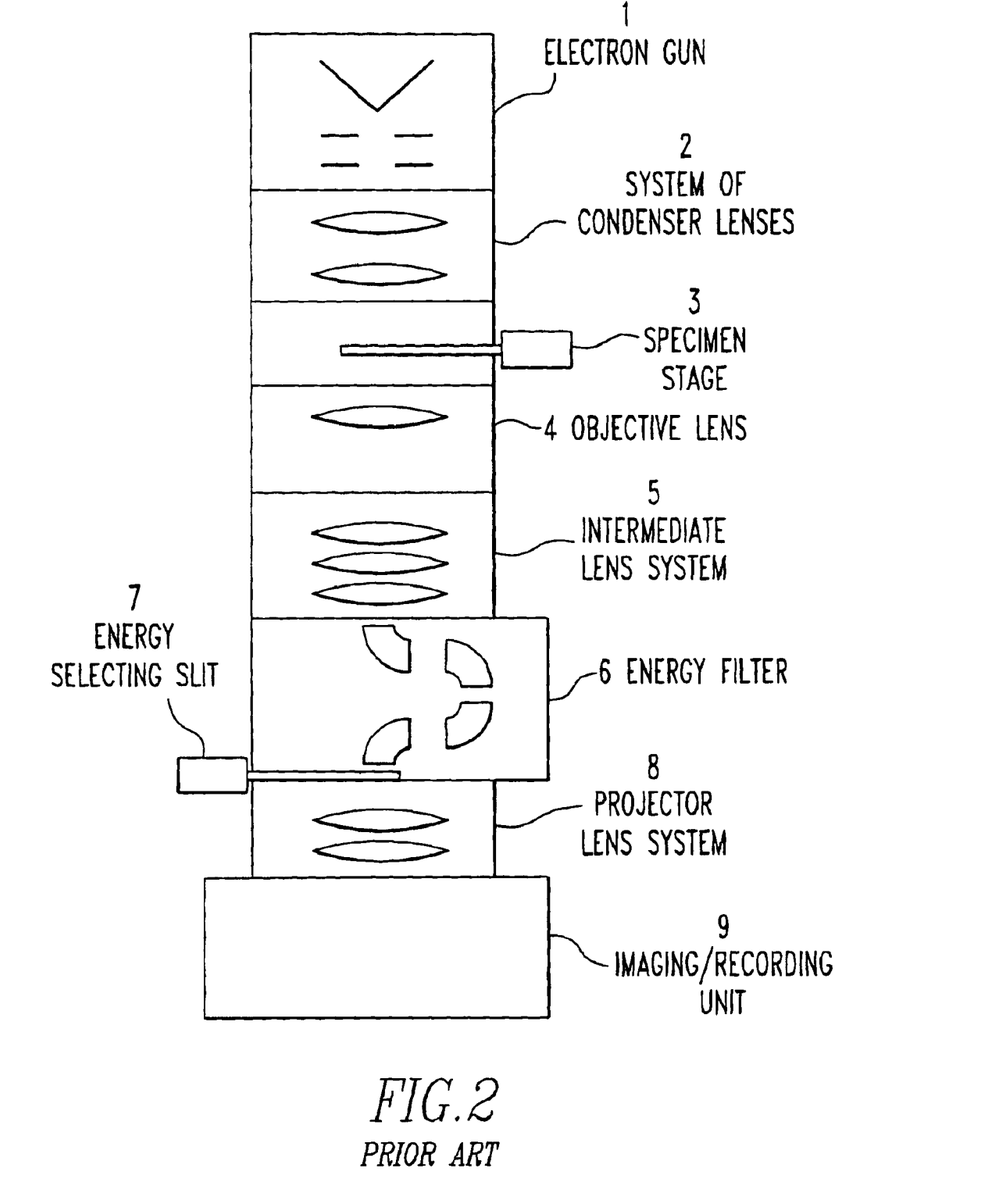
FIG. 2 is a schematic vertical cross section of the prior art TEM equipped with energy filter.

An example of the structure of a TEM equipped with an energy filter is shown in FIG. 2. Shown in this figure are an electron gun 1, a system of condenser lenses 2, a specimen stage 3 including a specimen holder, an objective lens 4, an intermediate lens system 5, an energy filter 6, an energy selecting slit 7, a projector lens system 8, and an imaging/recording unit 9.

Note that the "projector lens" referred to herein means a lens located between the energy filter 6 and the imaging/recording unit 9. The "intermediate lenses" mean one or more lenses positioned between the objective lens 4 and the energy filter 6. The imaging/recording unit 9 is made of a fluorescent screen, a photography device, or a TV camera.

The energy filter 6 acts to energy-disperse incident electrons. Various kinds of energy filters are known. For example, various energy filters each made up of two or more electromagnets are known as omega, alpha, gamma, and mandolin-type filters according to their orbital geometry of electrons within the energy filter 6. Furthermore, a Wien filter making use of electric and magnetic fields that are made to overlap with each other is known. Any type can be used as the energy filter 6 shown in FIG. 2. For convenience, an omega filter is used below.

One known intermediate lens system, such as the intermediate lens system 5, is made up of a single lens stage. Another known intermediate lens system is made up of two stages of lenses. A further known intermediate lens system consists of three stages of lenses. In the illustrated structure, the intermediate lens system is made of three stages of lenses. Each stage consists of one or more lenses. The projector lens system 8 is made of one or more stages of lenses, and each stage consists of one or more lenses.

Figure 3:
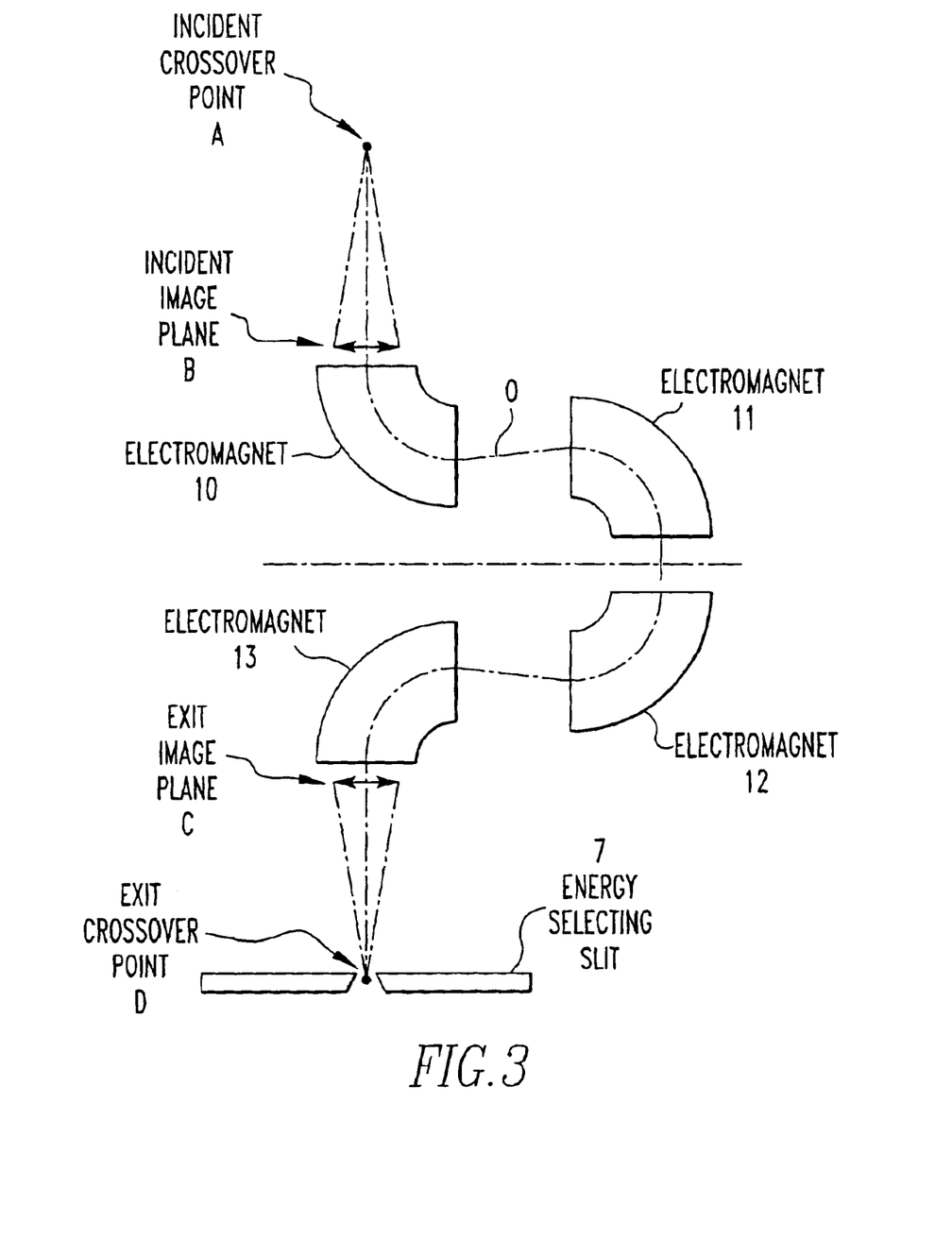
FIG. 3 is a schematic diagram of an omega-type energy filter, illustrating the configuration of the filter and four points defined in an energy filter.

Four points or locations are defined within the energy filter 6. For the description given below, these four locations are described by referring to FIG. 3. The omega filter is made up of four electromagnets 10, 11, 12, and 13 as shown in FIG. 3. The electromagnets 10 and 13 are vertically symmetrical with respect to a position indicated by the dot-and-dash line. Similarly, the electromagnets 11 and 12 are vertically symmetrical with respect to the position indicated by the dot-and-dash line. In FIG. 3, the central orbit of the electron beam in the omega filter is indicated by the broken line O.

The aforementioned four points are defined in FIG. 3, that is, these are an incident crossover point A, an incident image plane B, an exit image plane C, and an exit crossover point D.

The position of the exit image plane C is so set that electrons having different energies are focused at the same position. This plane C is also known as an achromatic image plane. On the other hand, the exit crossover point D is also termed an energy-dispersive plane. The slit 7 is positioned at this exit crossover point D.

These four points A, B, C, and D are defined strictly according to the design of the energy filter, and are important optical positions where they are used as components of the TEM equipped with energy filter. In order to minimize the imaging distortion of the energy filter and to secure the same imaging function as used in an ordinary TEM, these four points must be defined strictly. These four points A–D are defined in any structure including an omega filter.

The operation of each part of the TEM equipped with energy filter is now described.

(1) Action of the intermediate lens system 5 in the TEM equipped with energy filter:

The intermediate lens system 5 acts to vary either the magnification of a TEM image that is a magnified image of a specimen or the camera length for a diffraction pattern.

The intermediate lens system also serves to bring an image and a diffraction pattern formed by the objective lens 4 into positions defined in the energy filter 6. In particular, where electrons having a desired energy are selected by the slit 7 and an image is observed, the intermediate lens brings the diffraction pattern formed at the back focal plane of the objective lens 4 to the incident crossover point A. Also, the intermediate lens system brings an image formed by the objective lens 4 to the incident image plane B. Where electrons having a desired energy are selected by the slit 7 and a diffraction pattern is observed, the intermediate lens system brings an image formed by the objective lens 4 to the incident crossover point A. Also, the intermediate lens brings a diffraction pattern formed at the back focal plane of the objective lens 4 to the incident image plane B.

In summary, the intermediate lens system 5 performs the following three actions:

(i) The intermediate lens system 5 brings an image or a diffraction pattern that is conjugate with the image to the incident crossover point A defined in the energy filter 6.

(ii) The intermediate lens system 5 brings a diffraction pattern or an image that is conjugate with the diffraction pattern to the incident image plane B defined in the energy filter 6.

(iii) In the imaging mode, the intermediate lens system 5 can vary the magnification in minute steps over a wide range. In the diffraction mode, the intermediate lens system 5 can vary the camera length in minute steps over a wide range.

To perform these three actions, it is necessary to fabricate the intermediate lens system 5 from three stages of lenses, because any one lens cannot alone satisfy each of the three conditions described above. Three stages of lenses are so adjusted as to complement each other in satisfying the three conditions.

(2) Action of the energy filter 6 in the TEM equipped with energy filter:

Electrons emitted by the electron gun 1 are focused onto the specimen by the system of condenser lenses 2. If the thickness of the specimen is only several micrometers or less, the electrons are transmitted through the specimen. During this process, the electrons interact with atoms and electrons constituting the specimen, whereby energy loss takes place. The energy loss is not uniform for all electrons but has a probability distribution that is characteristic of the specimen.

In the TEM equipped with energy filter, electrons are energy-dispersed by the energy filter 6. The energy loss distribution is analyzed. Thus, the state of electrons, such as free electrons and bound electrons within the specimen, can be known. Furthermore, if the slit 7 is placed in the exit crossover point D in the energy filter 6, and if only electrons suffering from certain energy loss are selected by the slit 7 and imaged, then a two-dimensional distribution image of energy loss in the specimen can be obtained. This can be applied to analysis of elements constituting the specimen or can be used to improve the image contrast.

In the imaging mode as described above, the intermediate lens system 5 forms a diffraction pattern at the incident crossover point A. Also, the intermediate lens system 5 forms an image at the incident image plane B. The diffraction pattern at the incident crossover point A is focused at the exit crossover point D by the electron-refracting action of the energy filter 6. The image at the incident image plane B is focused at the exit image plane C.

In the diffraction mode, the intermediate lens system 5 forms an image at the incident crossover point A. Also, the intermediate lens system 5 forms a diffraction pattern at the incident image plane B. The image at the incident crossover point A is focused at the exit crossover point D by the electron-focusing action of the energy filter 6. The diffraction pattern at the incident image plane B is focused at the exit image plane C.

(3) Action of the projector lens system 8 in the TEM equipped with energy filter:

An image or a diffraction pattern is focused at the exit imaging plane C in the energy filter 6. An energy loss spectrum is focused at the exit crossover point D. Which of them is projected onto the image-receiving surface of the imaging/recording unit 9 depends on whether the projector lens system 8 is focused at the exit image plane C or the exit crossover point D. If the projector lens system 8 is focused at the exit image plane C, then the image or diffraction pattern is created or recorded on the imaging/recording unit 9. If the projector lens system 8 is focused at the exit crossover point D, then the energy loss spectrum is formed or recorded on the imaging/recording unit 9.

In this way, the projector lens system 8 acts to select the imaging mode, i.e., whether the image/diffraction pattern focused by the energy filter 6 or the energy loss spectrum is finally focused.

All of the condenser lenses 2, objective lens 4, intermediate lenses 5, and projector lenses 8 are magnetic lenses. When a magnetic lens focuses an image, electrons are rotated about the optical axis. Let the center axis along the optical axis be the Z-axis. When electrons move from a position indicated by $Z=z_1$ to a position indicated by $Z=z_2$ across the magnetic lens, the electrons rotate through an angle $\phi$ given by:

$$\phi = \sqrt{\frac{e}{8mU^*}} \int_{z_1}^{z_2} B(z)\,dz \qquad (1)$$

where e is the electron charge of an electron, m is the mass of an electron, $U^*$ is the relativistically modified accelerating voltage, and B(z) is the strength of the magnetic field at Z-coordinate z. Note that:

$$U^* = E\left(1 + e\frac{E}{2m_0c^2}\right)$$

where E is the accelerating voltage, e is the elementary charge, $m_0$ is the electron rest mass, and c is the velocity of light.

Rotation caused by the focusing action of the intermediate lens system 5 is now discussed. Since the intermediate lens system 5 is sufficiently remote from the specimen, the lens action of the intermediate lens system 5 does not reach the specimen. Accordingly, with respect to the intermediate lens system 5, the $z_1$ and $Z_2$ included in Eq. (1) above can be taken as $-\infty$ and $+\infty$, respectively. In this case, Eq. (1) can be simplified into the form:

$$\phi = 0.186 \cdot \frac{NI}{\sqrt{U^*}} \text{(radian)} \qquad (2)$$

where N is the number of turns of wire on the coil that causes the lens to produce a magnetic field and I is the excitation current (hereinafter also referred to as the lens current) fed to the coil. Therefore, it can be seen that the angle $\phi$ is in proportion to the product of the number of turns of the wire on the coil and the lens current fed to it. The polarity of the lens current is also taken into account. That is, where a lens current flowing in a direction is taken to have a positive polarity, a lens current flowing in the reverse direction is taken to have a negative polarity. This principle also applies to the following description.

In this way, the angle varies according to the lens current flowing through the lens. That is, when the lens conditions are varied, the image or diffraction pattern is rotated. In the TEM equipped with energy filter, the intermediate lens system 5 has only three stages and so it is possible to perform only the actions (i), (ii), and (iii) described above; it has been impossible to control the angle.

Therefore, if the magnification of the image or the camera length for the diffraction pattern is varied, and if the mode is changed from imaging mode to diffraction mode or vice versa, rotation upsets the angular relation between the finally obtained image or diffraction pattern and the specimen.

One countermeasure against this problem is to measure the angle of rotation when the mode is varied from imaging mode to diffraction mode or vice versa. Where the magnification or the camera length is modified, the angle is previously measured in each step. However, it is very cumbersome to analyze plural images of different magnifications and diffraction patterns. Consequently, the analysis tends to produce erroneous results.

SUMMARY OF THE INVENTION

Accordingly, it is an object of the present invention to provide a transmission electron microscope (TEM) equipped with energy filter that permits the angular position of an image or diffraction pattern to be controlled when lens conditions are modified.

The above-described object is achieved by a TEM equipped with energy filter comprising an objective lens system, a first intermediate lens system, a second intermediate lens system, a third intermediate lens system, a fourth intermediate lens system, an energy filter, and a projector lens system. Each lens system consists of at least one lens.

This microscope is characterized in that an excitation current supplied to each of the lenses is controlled to prevent rotation of a created image.

In one aspect of the present invention, if the mode of operation of the microscope is varied from the imaging mode to the diffraction mode or vice versa, if the magnification is modified in the imaging mode, or if the camera length is changed in the diffraction mode, the total sum of the products of the numbers of turns of wire on coils of the lenses of the various systems (i.e., the objective lens system, the first intermediate lens system, the second intermediate lens system, the third intermediate lens system, the fourth intermediate lens system, and the projector lens system) and their respective excitation currents is kept constant.

In another aspect of the present invention, each value of the products of the numbers of turns of wire on the coils of the objective lens system and their respective excitation currents is multiplied by a coefficient k.

In a further aspect of the present invention, there is further provided a look-up table in which the excitation currents supplied to the lenses of the various systems are stored for plural modes of operation, various values of magnification, and various values of camera length.

Other objects and features of the invention will appear in the course of the description thereof, which follows.

DESCRIPTION OF THE PREFERRED EMBODIMENTS

Figure 1:
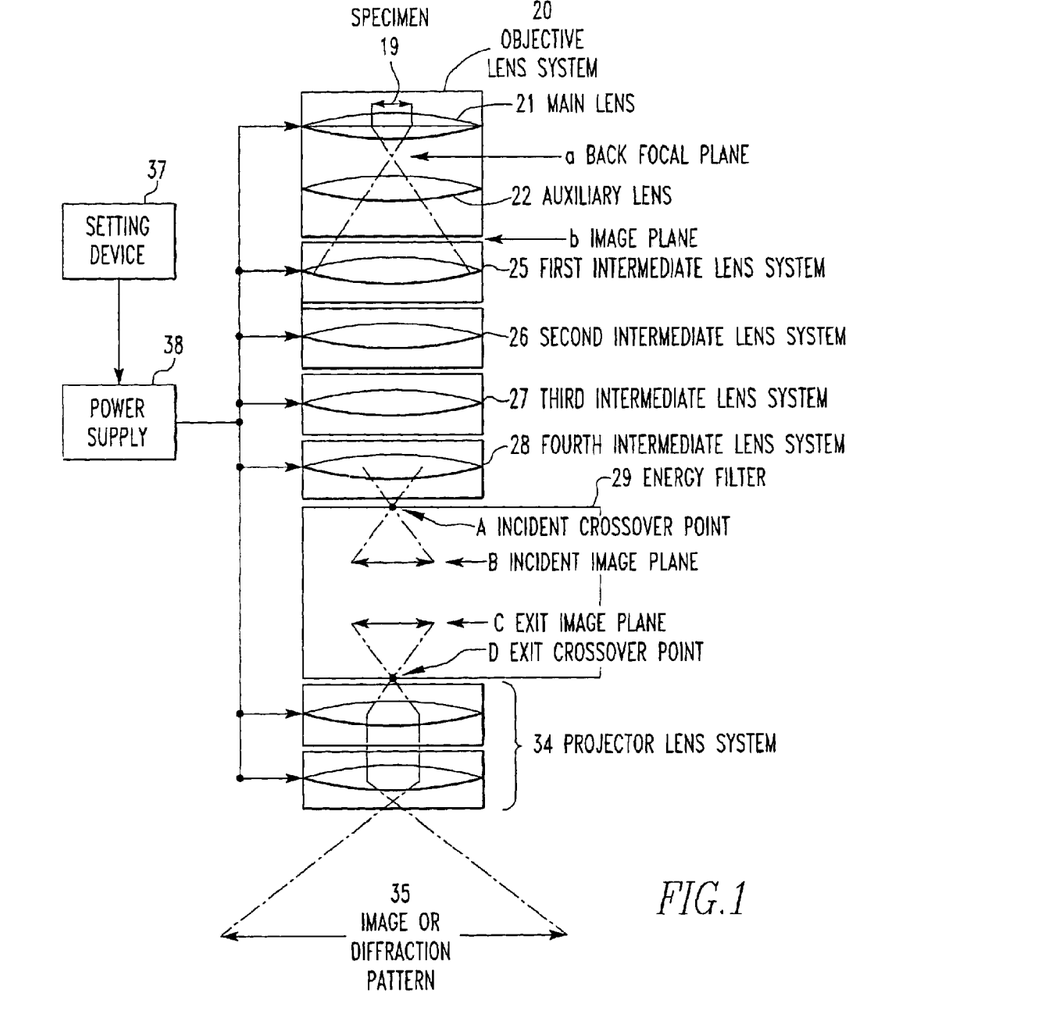
FIG. 1 is a schematic vertical cross section partially in block diagram form of a TEM equipped with energy filter in accordance with an embodiment of the present invention.

Referring to FIG. 1, there is shown a TEM equipped with energy filter in accordance with the present invention. Shown in this figure are a specimen 19, an objective lens system 20, a first intermediate lens system 25, a second intermediate lens system 26, a third intermediate lens system 27, a fourth intermediate lens system 28, an energy filter 29, a projector lens system 34, an image or diffraction pattern 35 finally focused onto an imaging/recording unit (not shown), a setting device 37, and a power supply 38. The objective lens system 20 includes a main lens 21 and an auxiliary lens 22. The objective main lens 21 has a back focal plane a. The objective lens system 20 has an image plane b. For convenience of illustration, the back focal plane a of the objective main lens 21 and the image plane b of the objective lens system 20 are defined as shown in FIG. 1. Note that the back focal plane a and the image plane b do not always exist in the specific locations shown in FIG. 1. Points A, B, C, and D are locations defined in the energy filter 29. They are an incident crossover point A, an incident image plane B, an exit image plane C, and an exit crossover point D, in the same way as previously described in connection with FIG. 3. A counterpart of the slit 7 shown in FIG. 2 is omitted in FIG. 1. Furthermore, an electron gun and condenser lenses located on the upstream side of the specimen 19 are omitted in FIG. 1. In addition, the structure of the energy filter 29 is not shown in FIG. 1. This energy filter may be either an omega-type filter as mentioned previously or other filter.

The setting device 37 permits an operator to set the mode of operation to either the diffraction mode or the imaging mode. In the imaging mode, the operator can set the magnification through the setting device 37. In the diffraction mode, the operator can set the camera length through the setting device 37.

The power supply 38 determines excitation currents supplied to the objective lens system 20, first intermediate lens system 25, second intermediate lens system 26, third intermediate lens system 27, fourth intermediate lens system 28, and projector lens system 34 according to the mode of operation, magnification, or camera length set through the setting device 37, and supplies these currents to these lens systems.

This TEM is equipped with six lens systems, i.e., objective lens system 20, first intermediate lens system 25, second intermediate lens system 26, third intermediate lens system 27, fourth intermediate lens system 28, and projector lens system 34.

Each of these lens systems consists of at least one lens. Each system of lenses acts as an optical component. For example, the objective lens system 20 is made up of two lenses, i.e., objective main lens 21 and objective auxiliary lens 22. Where the magnification in the imaging mode is more than approximately 5,000 times, i.e., at so-called high/medium magnifications, only the objective main lens 21 is used and strongly excited without using the objective auxiliary lens 22 to secure a high resolution. The focal distance is shortened. Where the magnification is up to about 5,000 times, i.e., at so-called low magnifications, a weak lens current is fed to the objective main lens 21 to have a long focal distance. Otherwise, only the objective auxiliary lens 22 is used or both lenses are used simultaneously.

Since this TEM is equipped with the four intermediate lens systems, i.e., the first intermediate lens system 25, second intermediate lens system 26, third intermediate lens system 27, and fourth intermediate lens system 28, the aforementioned actions (i), (ii), and (iii) can be performed by adjusting the lens currents supplied to these four lens systems. In addition, the angle can be controlled by adjusting the lens currents.

Especially, when the angle is controlled, if the mode of operation is varied from the imaging mode to the diffraction mode or vice versa, if the magnification is modified in the imaging mode, or if the camera length is changed in the diffraction mode, rotation of the created image or diffraction pattern can be prevented by varying the magnitudes of the excitation currents fed to the objective lens system 20 and to the projector lens system 34 and the combination of the polarities of the currents, in addition to the magnitudes of the excitation currents fed to the four intermediate lens systems and their polarities, to always achieve the relation:

$$(NI)_1 + (NI)_2 + (NI)_3 + (NI)_4 + (NI)_5 + (NI)_6 = \text{constant} \quad (3)$$

where $(NI)_1$ is the total sum of the products of the numbers of turns of wire N on the coils and their respective excitation currents I (including polarities) for all the lenses of the objective lens system 20, $(NI)_2$ is the total sum of the products of the numbers of turns of wire N on the coils and their respective excitation currents I (including polarities) for all the lenses of the first intermediate lens system 25, $(NI)_3$ is the total sum of the products of the numbers of turns of wire N on the coils and their respective excitation currents I (including polarities) for all the lenses of the second intermediate lens system 26, $(NI)_4$ is the total sum of the products of the numbers of turns of wire N on the coils and their respective excitation currents I (including polarities) for all the lenses of the third intermediate lens system 27, $(NI)_5$ is the total sum of the products of the numbers of turns of wire N on the coils and their respective excitation currents I (including polarities) for all the lenses of the fourth intermediate lens system 28, and $(NI)_6$ is the total sum of the products of the numbers of turns of wire N on the coils and their respective excitation currents I (including polarities) for all the lenses of the projector lens system 34.

In the process for finding Eq. (2) from Eq. (1), the intermediate lens system 5 shown in FIG. 2 is taken as an example, and we have stated "Rotation caused by the focusing action of the intermediate lens system 5 is now discussed. Since the intermediate lens system 5 is sufficiently remote from the specimen, the lens action of the intermediate lens system 5 does not reach the specimen. Accordingly, with respect to the intermediate lens system 5, the $z_1$ and $Z_2$ included in Eq. (1) above can be taken as $-\infty$ and $+\infty$, respectively." This theory directly applies to the lenses of the five lens systems shown in FIG. 1, i.e., first intermediate lens system 25, second intermediate lens system 26, third intermediate lens system 27, fourth intermediate lens system 28, and projector lens system 34. However, the theory does not strictly apply to the objective lens system 20 close to the specimen. Accordingly, for stricter calculations, k(NI) is used (where k is a coefficient) instead of the total sum $(NI)_1$ of the products of the numbers of turns of wire N on the coils and their respective excitation currents I (including polarities) for all the lenses of the objective lens system 20, the total sum $(NI)_1$ being included in Eq. (3). That is, k(NI) is obtained by multiplying the total sum $(NI)_1$ by the coefficient k, which is derived experimentally. Although the coefficient k varies according to each individual instrument, the coefficient generally assumes values given by 1>k>0.5. Therefore, strictly, Eq. (3) can be expressed by:

$$k(NI)_1+(NI)_2+(NI)_3+(NI)_4+(NI)_5+(NI)_6=\text{constant} \quad (4)$$

The operation of the instrument constructed in this way is described in detail. It is assumed that the operator sets the mode of operation to the imaging mode and determines the magnification through the use of the setting device 37. The power supply 38 determines the excitation currents supplied to the lenses to realize the set magnification in imaging mode, and supplies the set excitation currents to the lenses of the 6 lens systems, i.e., objective lens system 20, first intermediate lens system 25, second intermediate lens system 26, third intermediate lens system 27, fourth intermediate lens system 28, and projector lens system 34. Of course, the excitation currents fed to the lenses and their polarities satisfy Eq. (3) above. Consequently, the diffraction pattern formed at the back focal plane a of the objective main lens 21 is brought into the incident crossover point A in the energy filter 29. An image formed at the image plane b of the objective lens system 20 is brought to the incident image plane B of the energy filter 29. The projector lens system 34 is focused at the exit image plane C of the energy filter 29. Therefore, the final image is focused at position 35 shown in FIG. 1 at the set magnification.

The excitation currents supplied to the lenses are determined to satisfy Eq. (3) or (4) in the manner described below. The numbers of turns of wire on each coil of the lens systems are known. Therefore, for each individual lens, the excitation current is determined computationally or experimentally at each value of the magnification. Each value of excitation current is written into a look-up table (LUT). Using the magnification set by the use of the setting device 37 as an input address for the look-up table, the excitation currents to the lenses of the lens systems at this magnification are read from the look-up table.

A similar theory applies to the case in which the mode of operation is set to the diffraction mode by the use of the setting device 37 and its camera length is set. Specifically, the power supply 38 determines excitation currents to the lenses to accomplish the set camera length in the diffraction mode, and supplies the determined currents to the lenses of the six lens systems, i.e., objective lens system 20, first intermediate lens system 25, second intermediate lens system 26, third intermediate lens system 27, fourth intermediate lens system 28, and projector lens system 34. At this time, of course, the excitation currents supplied to the lenses of these systems and their polarities satisfy Eq. (3) or (4) above. As a result, the diffraction pattern formed at the back focal plane a of the objective main lens 21 is brought to the incident image plane B of the energy filter 29. The image formed at the image plane b of the objective lens system 20 is brought to the incident crossover point A of the energy filter 29. The projector lens system 34 is focused at the exit image plane C of the energy filter 29. Finally, the diffraction pattern is focused at the position 35 shown in FIG. 1 at the set camera length.

The excitation currents supplied to the lenses are determined to satisfy Eq. (3) or (4) in the manner described below. The numbers of turns of wire on each coil of the lenses are known. Therefore, for each individual lens, the excitation current is determined computationally or experimentally at each value of the camera length. Each value of excitation current is written into a look-up table (LUT). Using the camera length set by the use of the setting device 37 as an input address for the look-up table, the excitation currents to the lenses at this camera length are read from the look-up table.

Figure 4A:
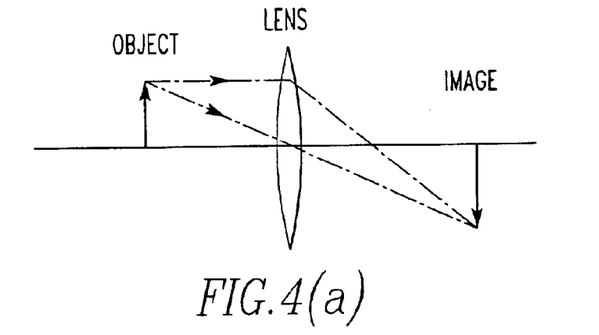
FIGS. 4(a), 4(b), and 4(c) are schematic diagrams of a "real image formation" and "virtual image formations".

In the above description, no distinction is made between real image formation and virtual image formation in the focusing action of lenses. Therefore, in the lens systems associated with image formation process from the objective lens system 20 of FIG. 1 to the project lens system 34, the aforementioned contents alone may, in fact, produce problems depending on the combination of the number of real images formed and the number of virtual images formed. This is described in further detail below. Also, a method of avoiding this is described.

Where an object plane and an image plane are placed on the opposite sides of a lens (FIG. 4(a)), the phenomenon is called "real image formation". Depending on the action of the lens, the image is inverted. That is, in the case of real image formation, the image is inverted.

Figure 4B:
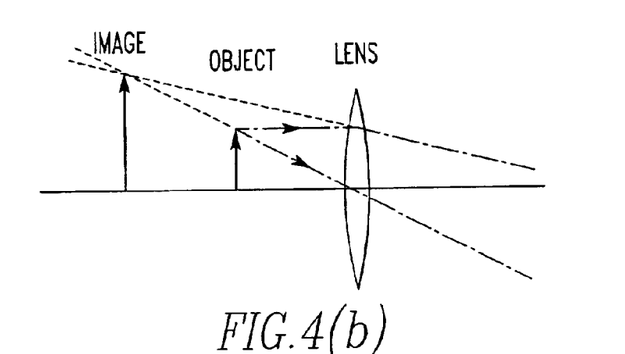
Figure 4C:
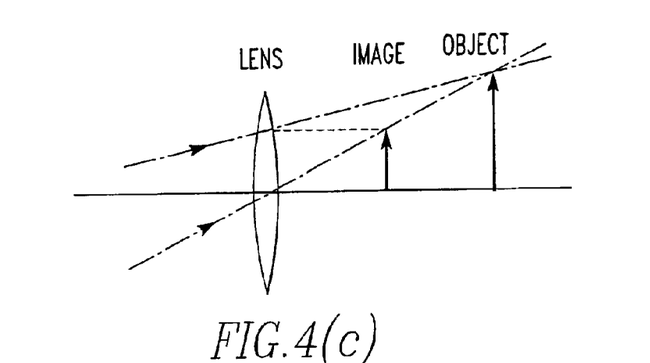

On the other hand, where an object plane and an image plane are on one side of a lens (FIGS. 4(b), 4(c)), the phenomenon is called "virtual image formation". In this case, the image is an erect one unlike the case of real image formation. That is, in the case of virtual image formation, the image is not inverted. The virtual image formation has two cases. In one case, an object plane and an image plane are in front of a lens (FIG. 4(b)). In the other case, they are behind a lens (FIG. 4(c)). In this case, whenever one real image is formed, the image is inverted. In particular, it can be considered that the inverted image in the case of real image formation involves rotation owing to the magnetic field given by Eq. (2) and additional 180° ($\pi$-radian) rotation. Accordingly, if the number of real images formed by the whole lens system associated with imaging is even, then inversion can be neglected. However, if the number is odd, it is necessary to take account of one inversion.

For the reason described above, in the cases of Eqs. (3) and (4), the image rotation differs by 180° (π-radian), depending on whether the number of real images formed by the whole lens system associated with focusing is odd or even.

Whether the image formed by one lens in a lens system associated with imaging is real or virtual is not fixed because it depends on the imaging mode used, the magnification, and the camera length. However, it can be easily known when the optics are designed and the lenses are set. Therefore, if the optics are designed and the lenses are set according to the imaging mode used, magnification, and camera length, then it is automatically determined whether the image formed by each lens is real or virtual. This, in turn, determines the number of real images and the number of virtual images formed by the whole lens system associated with imaging.

Modifying Eq. (3) based on this leads to the following conclusions:
Where the number of real images formed is even:

$$(NI)_1+(NI)_2+(NI)_3+(NI)_4+(NI)_5+(NI)_6 = \text{constant} + 2nP \quad (5\text{-}1)$$

Where the number of real images formed is odd:

$$(NI)_1+(NI)_2+(NI)_3+(NI)_4+(NI)_5+(NI)_6 = \text{constant} + (2n-1)P \quad (5\text{-}2)$$

In the above equations, P is lens excitation necessary to rotate the image through 180° (π-radian) and given by $$P = \frac{\pi\sqrt{U^*}}{0.186} = 16.89\sqrt{U^*} \quad (6)$$

n is an arbitrary integer. Since rotations that are integral multiples of 360° (2π-radians) can be neglected, if n=0, Eq. (5-1) returns to Eq. (3).

Similarly, modifying Eq. (4) leads to:
Where the number of real images formed is even:

$$k(NI)_1+(NI)_2+(NI)_3+(NI)_4+(NI)_5+(NI)_6 = \text{constant} + 2nP \quad (7\text{-}1)$$

Where the number of real images formed is odd:

$$k(NI)_1+(NI)_2+(NI)_3+(NI)_4+(NI)_5+(NI)_6 = \text{constant} + (2n-1) \quad (7\text{-}2)$$

Whether the number of real images formed is odd or even is inevitably determined if the optics are designed and the lenses are set as mentioned previously. Consequently, the look-up table or tables are created using the results and taking account of a corrective term 2nP or (2n−1)P depending on whether the number of real images formed is even or odd.

It may be determined whether there is one inversion or not, depending on whether the number of virtual images formed is even or not, for the following reason. The number of lenses forming a whole lens system associated with imaging of a transmission electron microscope of interest is constant. Unused magnetic lenses, i.e., deenergized magnetic lenses, are regarded to create virtual images. The number of virtual images formed is subtracted from the total number of lenses. Then, the result is equal to the number of real images formed.

As described thus far, this TEM equipped energy filter is fitted with four intermediate lens systems, i.e., first, second, third, and fourth intermediate lens systems. This provides a larger number of degrees of freedom in controlling the electron beam. Hence, the angular position of the image or diffraction pattern can be controlled.

If the mode of operation is varied from the imaging mode to the diffraction mode or vice versa, if the magnification is modified in the imaging mode, or if the camera length is changed in the diffraction mode, the total sum of the products of the numbers of turns of wire on the coils of the lenses of the various lens systems including the objective lens system, four intermediate lens systems, and the projector lens system, and their respective excitation currents is kept constant. Therefore, the angular position of the image from the specimen to the final image and the angular position of the diffraction pattern can be maintained constant. Consequently, the image and diffraction pattern can be elucidated and analyzed with greater ease.

Having thus described my invention with the detail and particularity required by the Patent Laws, what is desired protected by Letters Patent is set forth in the following claims.

What is claimed is:

1. A transmission electron microscope equipped with energy filter comprising:
   an objective lens system consisting of at least one lens excited with excitation current;
   a first intermediate lens system consisting of at least one lens excited with excitation current;
   a second intermediate lens system consisting of at least one lens excited with excitation current;
   a third intermediate lens system consisting of at least one lens excited with excitation current;
   a fourth intermediate lens system consisting of at least one lens excited with excitation current;
   a projector lens system consisting of at least one lens excited with excitation current; and
   means for adjusting the excitation currents supplied to the lenses, thus preventing rotation of a created image.

2. The transmission electron microscope equipped with energy filter of claim 1, wherein if the mode of operation of the microscope is varied from the imaging mode to the diffraction mode or vice versa, if magnification is modified in the imaging mode, or if camera length is changed in the diffraction mode, the total sum of products of the numbers of turns of wire on coils of the lenses of said objective lens system, first intermediate lens system, second intermediate lens system, third intermediate lens system, fourth intermediate lens system, and projector lens system and their respective excitation currents is kept constant.

3. The transmission electron microscope equipped with energy filter of claim 2, wherein each value of the products of the numbers of turns of wire on the coils of the objective lens system and their respective excitation currents is multiplied by a coefficient k.

4. The transmission electron microscope equipped with energy filter of claim 2 or 3, wherein there is further provided a look-up table in which the excitation currents supplied to the lenses of the various lens systems are stored for plural modes of operation, various values of magnification, and various values of camera length.

5. A transmission electron microscope equipped with energy filter comprising:
   an objective lens system consisting of at least one lens excited with excitation current;
   a first intermediate lens system consisting of at least one lens excited with excitation current;
   a second intermediate lens system consisting of at least one lens excited with excitation current;
   a third intermediate lens system consisting of at least one lens excited with excitation current;

a fourth intermediate lens system consisting of at least one lens excited with excitation current;

a projector lens system consisting of at least one lens excited with excitation current; and means for adjusting the excitation currents supplied to the lenses;

wherein, (1) when the number of real images formed by said lenses is even, the total sum of the products of the numbers of coil turns of the lenses of the objective lens system, the first intermediate lens system, the second intermediate lens system, the third intermediate lens system, the fourth intermediate lens system, and the projector lens system and their respective excitation currents are kept constant, and (2) when the number of real images formed is odd, the total sum is kept constant and, furthermore, the image is rotated through 180°, if the mode of operation is switched from an imaging mode to a diffraction mode or vice versa, if the magnification is varied in the imaging mode, or if the camera length is varied in the diffraction mode.

6. A transmission electron microscope equipped with energy filter as set forth in claim 5, wherein the values of the products of the numbers of coil turns of the lenses of said objective lens system and their respective excitation currents are multiplied by a coefficient k.

7. A transmission electron microscope equipped with energy filter as set forth in claim 5 or 6, wherein there is provided a look-up table in which relations of plural values of magnification in the imaging mode to excitation current values of the lenses of the various lens systems for achieving these values of magnification are stored, and wherein there is provided another look-up table in which relations of plural values of camera length in the diffraction mode to excitation current values of the lenses of the various lens system for achieving these values of camera length are stored.

* * * * *